(12) United States Patent
Meijer et al.

(10) Patent No.: US 7,808,174 B2
(45) Date of Patent: Oct. 5, 2010

(54) POLYMER LIGHT-EMITTING DIODE

(75) Inventors: Eduard Johannes Meijer, Eindhoven (NL); Eric Alexander Meulenkamp, Eindhoven (NL); Ralph Kurt, Eindhoven (NL); Steve Klink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 317 days.

(21) Appl. No.: 11/722,708

(22) PCT Filed: Jan. 13, 2006

(86) PCT No.: PCT/IB2006/050125

§ 371 (c)(1),
(2), (4) Date: Jun. 22, 2007

(87) PCT Pub. No.: WO2006/077509

PCT Pub. Date: Jul. 27, 2006

(65) Prior Publication Data

US 2008/0265752 A1 Oct. 30, 2008

(30) Foreign Application Priority Data

Jan. 21, 2005 (EP) .................................. 05100362

(51) Int. Cl.
*H01J 1/62* (2006.01)
*H01L 35/24* (2006.01)
(52) U.S. Cl. .................. 313/504; 313/503; 313/498; 313/499; 257/10; 257/548; 257/655; 438/20
(58) Field of Classification Search .............. 313/504, 313/498, 499
See application file for complete search history.

(56) References Cited

U.S. PATENT DOCUMENTS 6,235,414 B1  5/2001  Epstein

FOREIGN PATENT DOCUMENTS

EP  0439627 A1  8/1991

OTHER PUBLICATIONS

Gang Yu et al: "Polymer Light-Emitting Electrochemical Cells With Frozen P-I-N Junction At Room Temperature" Advanced Materials, Wiley VCH, Weinheim, DE, vol. 10, No. 5, 1998, pp. 385-388.
Gao Jun et al: "Polymer Light-Emitting Electrochemical Cells With Frozen Junctions" Journal of Applied Physics, American Institute of Physics. New York, US, vol. 86, No. 8, 1999, pp. 4594-4599.

(Continued)

*Primary Examiner*—Nimeshkumar D. Patel
*Assistant Examiner*—Jacob Stern

(57) ABSTRACT

A light-emitting diode (1) has a first electrode (3), a second electrode (4), a light-emitting layer (5) which comprises a matrix, and ions. A layer (6) of a cation receptor (CR) is positioned adjacent to the first electrode (3), has captured cations, and has generated immobilized cations (+). A layer (7) of an anion receptor (AR) is positioned adjacent to the second electrode (4), has captured anions, and has generated immobilized anions (−). The ion gradients provide for quick response in emission of light (L) when the diode (1) is exposed to a forward bias. A diode (1) is manufactured by first forming a laminate (2) of the above structure. The laminate (2) is exposed to a forward bias to make the ions become immobilized at respective sites (S1, S2) of the respective receptors (CR, AR).

8 Claims, 6 Drawing Sheets

OTHER PUBLICATIONS

Examination Report issued on Oct. 10, 2007 in a co-pending related EP application Serial No. 06701788.9 (Reference No. PHNL050015EP2).

Applicants' Response to Examination Report in a co-pending related EP application Serial No. 06701788.9 (Reference No. PHNL050015EP2) filed on Dec. 12, 2007.

Yu et al., Polymer light-emitting electrochemical cells with frozen p-i-n junction at room temperature, 1998, pp. 385-388, No. 5.

Gao et al., Polymer light-emitting electrochemical cells with frozen junctions, 1999, pp. 4594-4599, vol. 86, No. 8.

Wenzl et al, The influence of the phase morphology on the optoelectronic properties of light-emitting electrochemical cells, 2004, pp. 441-450.

$(C_6F_4)O_2B(C_6H_3F_2)$ $(C_6F_4)O_2B(C_6F_5)$ $(C_6F_4)O_2B(C_8H_3F_6)$ $(C_6F_{12})O_2B(C_6H_3F_2)$

POLYMER LIGHT-EMITTING DIODE

FIELD OF THE INVENTION

The present invention relates to a light-emitting diode comprising a first electrode, a second electrode and a light-emitting layer being positioned between the two electrodes and comprising a matrix.

The present invention also relates to a method of forming a light-emitting diode having a first electrode, a second electrode and a light-emitting layer being positioned between the two electrodes and comprising a matrix.

BACKGROUND OF THE INVENTION

Polymer light emitting electrochemical cells (LEC), which are useful in, among other applications, organic electro-luminescent flat displays and large area light sources, have the function of providing light emission upon an applied voltage without the need for a sensitive low work function metal cathode, which is needed in normal polymer light emitting diodes (PLED). In an LEC a solid electrolyte provides, upon the application of a voltage, the ion gradients needed for the injection of electrons from the cathode also in cases where the cathode is not a low work function electrode, and/or the ion gradients needed for the injection of holes from the anode. A problem with an LEC is that ion travel in the electrolyte makes the response slow. G. Yu et al have in their article "Polymer Light-Emitting Electrochemical Cells with Frozen p-i-n Junction at Room Temperature", which was published in Advanced Materials, 1998, 10, No. 5, page 385-388, proposed a solution to this slow response by providing a LEC having so called "frozen p-i-n junctions" and in practical operation working as a PLED. The frozen junctions were obtained by providing an electroluminescent polymer, mixing it with an electrolyte and sandwiching it between two electrodes to obtain a LEC. The LEC was heated to about 60-80° C. and then a voltage of about 3-4 V was applied. After the ion gradients had been generated the LEC was cooled to room temperature. The ion gradient became "frozen", i.e. the ions did not return to their normal position since their mobility was too low in the polymer in question at room temperature.

A disadvantage of the LEC according to G. Yu et al is that it is complicated to manufacture. Further it is sensitive to high temperatures, since an increased temperature would mean that the ions would start travelling again and would thus destroy the "frozen" ion gradients.

SUMMARY OF THE INVENTION

An object of the present invention is to provide a light-emitting diode having a quick response without the manufacturing costs and the large temperature sensitivity associated with the prior art LECs having "frozen" ion gradients.

This object is achieved by a light-emitting diode comprising a first electrode, a second electrode and a light-emitting layer being positioned between the two electrodes and comprising a matrix, the diode further comprising ions, a layer of a cation receptor, the latter layer being positioned between the first electrode and the light-emitting layer, and a layer of an anion receptor, the latter layer being positioned between the second electrode and the light-emitting layer, the layer of cation receptor having captured cations, thereby forming a concentration of immobilized cations at the first electrode, the layer of anion receptor having captured anions, thereby forming a concentration of immobilized anions at the second electrode, the ion gradients thus formed providing for injection of electrons from the first electrode and of holes from the second electrode when the light-emitting diode is exposed to a forward bias.

An advantage of this light emitting diode is that it provides a very quick response to an applied bias since the ion gradients are always in place and need not be generated as in the light-emitting electrochemical cells according to the prior art. A further advantage is that the ions are immobilized on receptors having electrostatic affinity for the ions in question. This makes the light-emitting diode according to the invention much less sensitive to high temperatures and time dependent degradation compared to the thermally "frozen" ion gradients of the prior art as described by G. Yu et al in the above mentioned article.

In relation to prior art LEDs a further advantage is that the present invention also enables the use of blue emitting polymers. Such polymers may have a large band gap, which makes it difficult to match with the work function of the anode and/or the cathode. With the ion gradients obtained in the present invention the efficient injection of holes and/or electrons also into blue emitting polymers is enabled.

An advantage with the measure according to claim 2 is that it provides for an increased life of the diode, as it is less sensitive to attack of oxygen and water, and a large freedom of choice as regards the electrode materials. The large ion gradients at the first and second electrode in the present invention makes it possible to use a high work function first electrode, which is to be operated as cathode in forward bias. Thereby the often-encountered disadvantages of sensitivity to water and oxygen in low work function electrodes are avoided. If both electrodes are made from high work function materials the question of which is the cathode and which is the anode in forward bias is determined only by where the layer of the anion receptor and the layer of the cation receptor are located.

An advantage of the measure according to claim 3 is that organic materials, which may be polymeric materials, but also organic molecules of substantially smaller size, are suitable for providing a solid electrolyte in which the ions can travel during an initialisation step but in which the cation receptor molecules and anion receptor molecules cannot migrate.

An advantage with the measure according to claim 4 is that polymeric materials provide suitable solid matrices in which ions are mobile during the initialisation step. The polymeric materials are often transparent. The fact that the polymeric materials are solid, still permitting the mobility of ions, makes manufacturing and handling of the light-emitting diode easier.

An advantage of the measure according to claim 5 is that ion travel is promoted during the initialisation of the diode.

An advantage of the measure according to claim 6 is that organic molecules are often well suited for application in thin layers, that often are at least semi-transparent, between an electrode and a light-emitting layer. Organic molecules can be synthesized in different shapes and can easily be made to form bulky structures that, due to their volume, cannot migrate through the matrix of the light-emitting layer.

An advantage of the measure according to claim 7 is that, as mentioned above, organic molecules are often well suited for providing thin layers of molecules that do not migrate through a light-emitting layer.

An advantage of the measure according to claim 8 is that it provides for making thin, large area lighting appliances or flat display panels in which light emitted by the light-emitting diode is to be emitted via a large face of the diode.

Another object of the present invention is to provide an efficient way of manufacturing a light-emitting diode having quick response, still avoiding the temperature sensitivity associated with the prior art LECs having "frozen" ion gradients.

This object is achieved by a method of forming a light-emitting diode having a first electrode, a second electrode and a light-emitting layer being positioned between the two electrodes and comprising a matrix, the diode further comprising ions, the method comprising providing a layer of a cation receptor between the first electrode and the light-emitting layer, and a layer of an anion receptor between the second electrode and the light emitting layer, applying an electrical field over the electrodes to make the first electrode the cathode and the second electrode the anode, such that the layer of cation receptor captures and immobilizes cations, thereby forming a concentration of immobilized cations at the first electrode, and that the layer of anion receptor captures and immobilizes anions, thereby forming a concentration of immobilized anions at the second electrode, said immobilized cations and said immobilized anions forming ion gradients providing for injection of electrons from the first electrode and of holes from the second electrode when the light-emitting diode is exposed to a forward bias.

An advantage of this method is that it provides for a simple method of manufacturing light-emitting diodes that have a quick response, a low sensitivity to high temperatures and a long expected life.

An advantage of the measure according to claim 10 is that an increased temperature makes the ion travel in the light-emitting layer quicker during the initialisation of the diode. This shortens the time needed to obtain the desired ion gradients making manufacturing quicker. A further advantage of this measure is that it also makes it possible to make use of polymers in which the ion travel is far to slow at room temperature.

BRIEF DESCRIPTION OF THE DRAWINGS

The invention will now be described in more detail with reference to the appended drawings in which.

DESCRIPTION OF PREFERRED EMBODIMENTS

Figure 1:
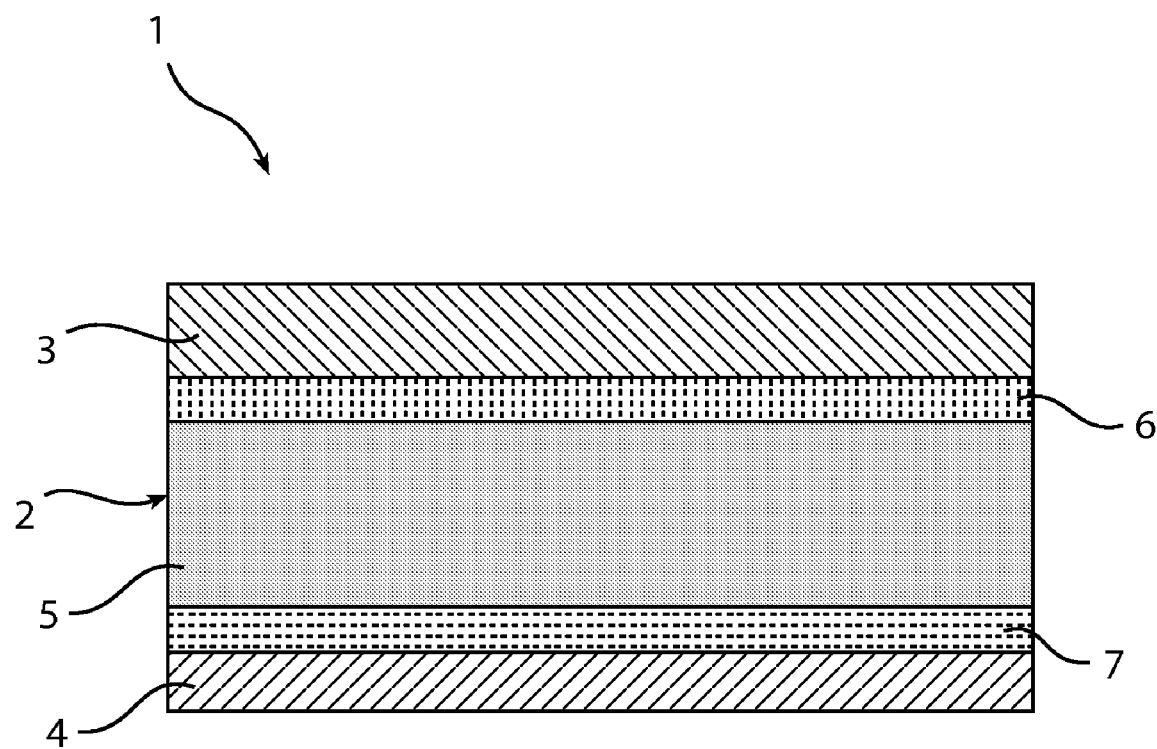
FIG. 1 is a schematic cross-section and shows a light-emitting diode.

FIG. 1 shows a light-emitting diode 1 according to the invention. The diode 1 has a laminate structure 2 and comprises a first electrode 3, a second electrode 4 and, positioned between the first electrode 3 and the second electrode 4, a light-emitting layer 5. The diode 1 is provided on a substrate (not shown in FIG. 1), which provides the diode 1 with mechanical support and includes the connections for the electrodes 3, 4.

The first electrode 3 works as a cathode when the diode 1 is subjected to an electrical field in forward bias. The first electrode 3 is made from a high work function material, for example gold, silver, aluminium or indium tin oxide (ITO). Examples of other alternative electrode materials could be found in, for example, the U.S. Pat. No. 5,682,043 granted to Pei et al. describing light-emitting electrochemical cells in general.

The second electrode 4 works as an anode when the diode 1 is subjected to an electrical field in forward bias. The second electrode 4 is made from an at least partly transparent, high work function electrode material, such as indium tin oxide (ITO). Other examples of alternative transparent electrode materials could be found in U.S. Pat. No. 5,682,043 (Pei et al).

In case the first electrode 3 is made of a transparent electrode material, such as ITO, the second electrode 4 need not necessarily be made of a transparent material, but could be made of, for example, gold, aluminium or another high work function metal electrode material.

The light-emitting layer 5 comprises a matrix and ions, which are movable in the matrix. The matrix is preferably a semiconducting polymeric material, such as a conjugated polymer or a co-polymer, which contains segments of p-conjugated moieties. Examples of suitable semiconducting polymeric materials can be found in the above-mentioned U.S. Pat. No. 5,682,043. The matrix could, as alternative, be made of another type of organic material, such as an organic material having substantially smaller molecular weight than the polymeric materials. The ions could be provided by salts comprising a cation, such as sodium ions, and an anion, such as chlorine ions. One particular example of a suitable salt is lithium triflate ($LiCF_3SO_3$) also described in U.S. Pat. No. 5,682,043. As an alternative the ions could be provided by a polymer electrolyte. Different types of ions suitable for a light-emitting electrochemical cell could be found, i.a., in the above mentioned US patent. A further alternative is to use, combined with a suitable matrix, transition metal complexes, such as ruthenium tris-bipyridine, $[Ru(bpy)_3]^{2+}$, combined with a suitable counter ion as is described by P. McCord and A. J. Bard, J. Electronal. Chem., 91, 318, 1991. The light-emitting layer can thus also comprise an insulating layer mixed with charged triplet emitter molecules.

A layer 6 of a cation receptor is located between the first electrode 3 and the light-emitting layer 5. The layer 6 of cation receptor contains organic molecules that are bulky and that have affinity for cations, as will be described later. The layer 6 of cation receptor has captured and immobilized a number of cations from the light-emitting layer 5. There is thus a high concentration of cations adjacent to the first electrode 3.

A layer 7 of an anion receptor is located between the second electrode 4 and the light-emitting layer 5. The layer 7 of anion receptor contains organic molecules that are bulky and that have affinity for anions, as will be described later. The layer 7 of anion receptor has captured and immobilized a number of anions from the light-emitting layer 5. There is thus a high concentration of anions adjacent to the second electrode 4.

Figure 2:
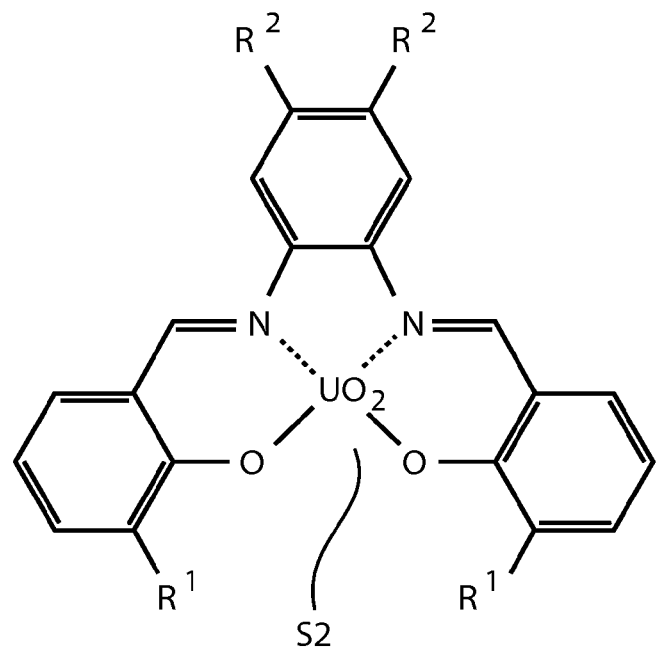
FIG. 2 is a schematic representation of a first alternative anion receptor molecule.

FIG. 2 illustrates an example of a molecule useful as a neutral anion receptor. The molecule, which has been described as such by M. M. G. Antonisse and D. N. Reinhoudt Chem. Comm. p 443 (1998), is based on an immobilized uranyl cation which is complexed in a salophen unit. The molecule has a site S2 in which the double oxygen atoms allow the capture and immobilization of an anion. The molecule could thus be used to form the layer 7 of anion receptor. Due to the salophen unit, in which the uranyl cation is complexed, the molecule becomes bulky and voluminous and cannot migrate through the light-emitting layer.

Figure 3:
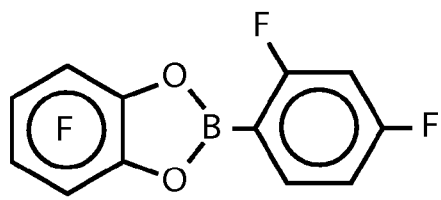
FIG. 3 is a schematic representation of further alternative anion receptor molecules.
Figure 3:
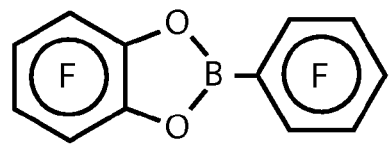
Figure 3:
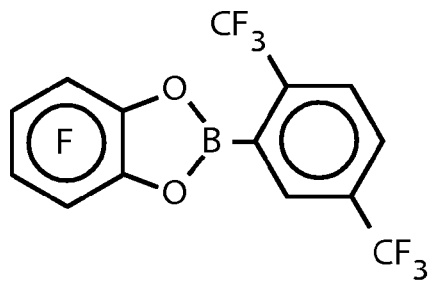
Figure 3:
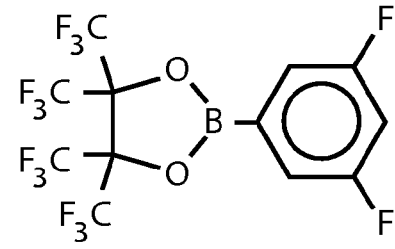

FIG. 3 illustrates a couple of additional examples of molecules useful as a neutral anion receptor. The molecules which, along with a couple of similar molecules that also could be used, have been described as such by H. S. Lee, X. Q. Yang, X. Sun and J. McBreen, J. Power Sources 97, 566 (2001), comprises a boronate group and at least one aromatic substance.

Further the anion receptor could also be provided in the form of a polymeric anion receptor providing a very low risk of migration into the light-emitting layer. Yet another alternative is to provide the anion receptor as a blend of anion receptor molecules and a matrix.

Figure 4:
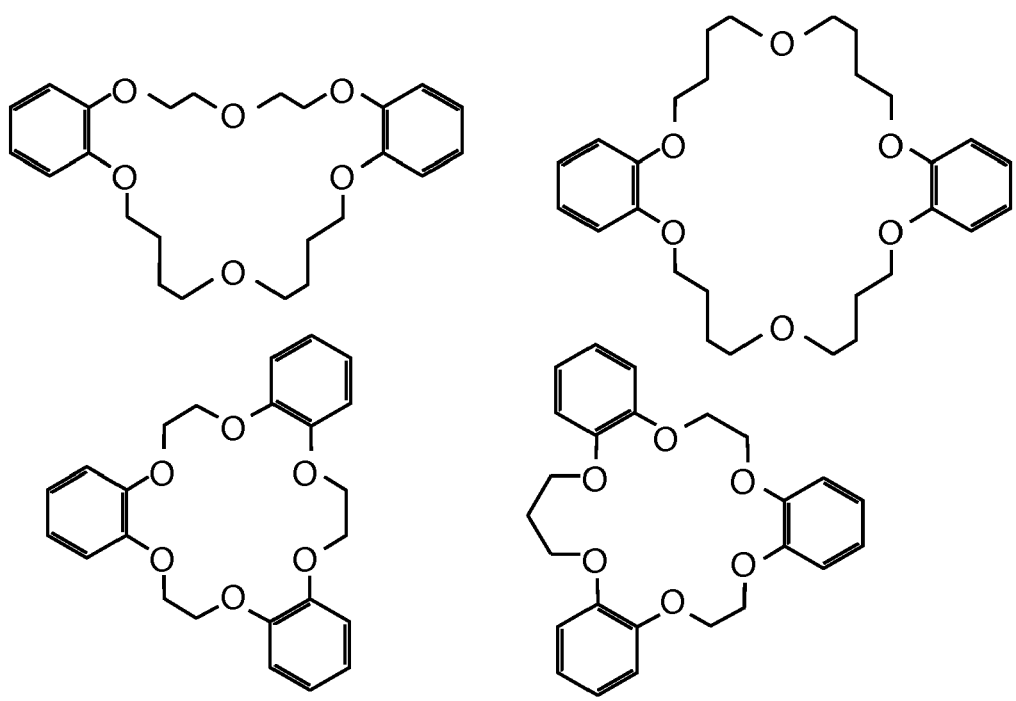
FIG. 4 is a schematic representation of first alternative cation receptor molecules.

FIG. 4 illustrates a couple of alternative molecules that could be used as a neutral cation receptor in the layer 6. The molecules, which have been described as such by C. J. Pedersen in J. Am. Chem. Soc. 89, 7017 (1967), are cyclic polyethers, also called crown ethers. Many saturated cyclic polyethers containing 5 to 10 oxygen atoms form stable complexes with some or all of the cations of the following substances: Li, Na, K, Rb, Cs, Ag, Au, Ca, Sr, Ba, Cd, Hg, La, Tl, Ce and Pb. Additionally other ions, such as $NH_4^+$ and $RNH_3^+$, may also form stable complexes with these cyclic polyethers. The cyclic polyether molecules with 5 to 10 oxygen atoms are in many cases bulky and voluminous and cannot migrate through the light-emitting layer 5. In addition to the above-described monocyclic polyethers also cryptates could be used.

Figure 5:
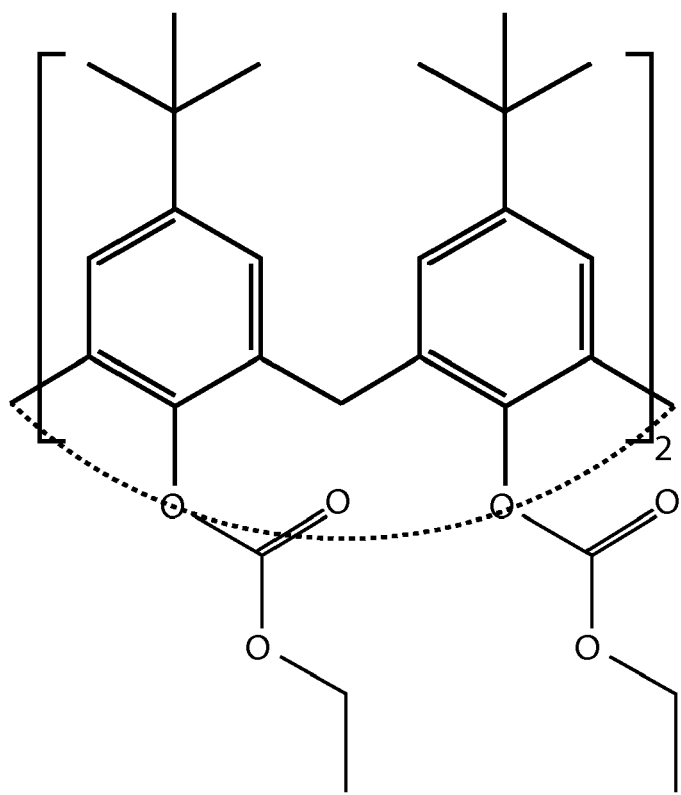
FIG. 5 is a schematic representation of an alternative cation receptor molecule.

FIG. 5 illustrates another example of a molecule useful as a neutral cation receptor. The molecule, which has been described as such by J. Vicens and V. Böhmer "Calixarenes: A versatile class of Macrocyclic Compounds", Topics in Inclusion Science, Kluwer Academic Press, Dordrecht, Vol. 3, 1989, is a calix[4]arene-based cation receptor.

Further the cation receptor could also be provided in the form of a polymeric cation receptor providing a very low risk of migration into the light-emitting layer. One example of such a polymer is a calixarene provided with a polymerisable group. Yet another alternative is to provide the cation receptor as a blend of cation receptor molecules and a matrix.

Yet another example of a molecule useful as a neutral cation receptor is a terphenyl-based cation receptor which is described as such by D. J. Cram and J. M. Cram "Container Molecules and their Guests", Monographs in Supramolecular Chemistry, J. F. Stoddart (Ed.), The Royal Society of Chemistry, London, 1994.

FIGS. 6a-6e show schematically the initial steps of forming a light-emitting diode according to the invention. The light emitting diode is intended for lighting application but it will be appreciated that a light-emitting diode forming part of an organic electro-luminescent flat display panel could be formed according to the same principles.

Figure 6A:
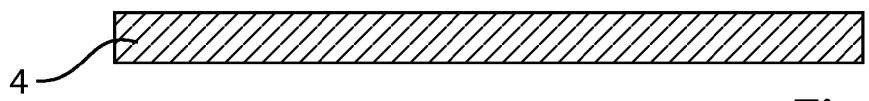
FIG. 6a illustrates a first step in fabricating a laminate for a diode according to the invention.

Firstly the second electrode 4, which is to function as an anode in forward bias, is provided, as is shown in FIG. 6a. The second electrode 4 is made of ITO which is a high work function material being substantially transparent. Optionally, and not shown, a layer of PEDOT/PSS, as is done in standard LED, could be applied on the second electrode 4 before the additional layers are applied.

Figure 6B:
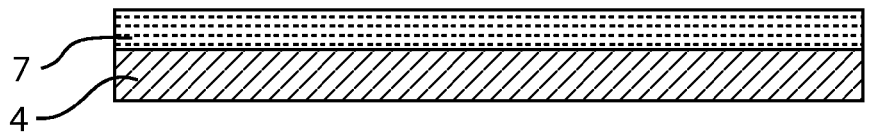
FIG. 6b illustrates a second step in fabricating a laminate for a diode according to the invention.
Figure 6C:
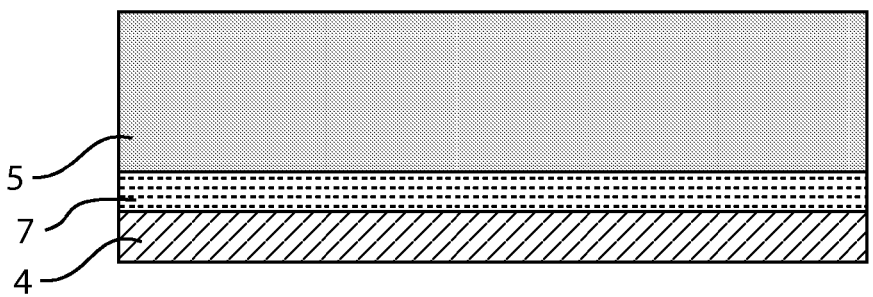
FIG. 6c illustrates a third step in fabricating a laminate for a diode according to the invention.

Then a thin layer 7 of an anion receptor, for instance the anion receptor described above with reference to FIG. 2, is applied on the second electrode 4 as is shown in FIG. 6b. Typically the layer 7 has a thickness in the range of 0.1-10 nm. The anion receptor is processable from a solution and can be applied as a thin layer by, for example, spin coating or inkjet printing. Furthermore the layer of an anion receptor may also be deposited by for example evaporation. In a subsequent step, illustrated in FIG. 6c, a mixture of light-emitting polymer, such as a conjugated polymer, and a salt, such as lithium triflate, is deposited on the layer 7 to form the light-emitting layer 5.

Figure 6D:
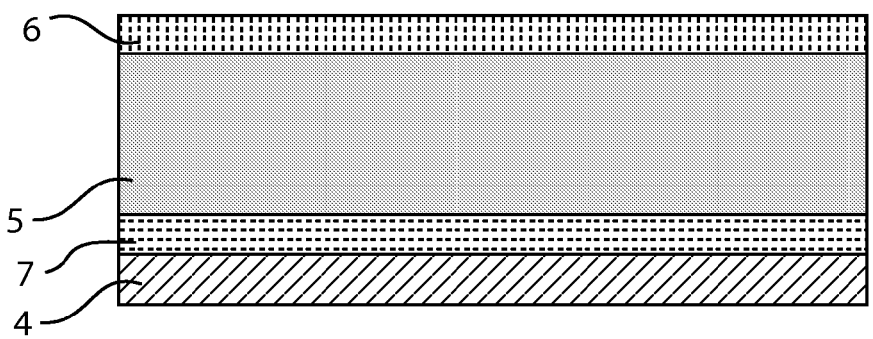
FIG. 6d illustrates a fourth step in fabricating a laminate for a diode according to the invention.

A thin layer 6 of a cation receptor, for instance a cyclic polyether as described above with reference to FIG. 4, is deposited on top of the light-emitting layer 5 as illustrated in FIG. 6d. Typically the layer 6 has a thickness in the range of 0.1-10 nm. The cation receptor is processable from a solution and can be applied as a thin layer by, for example, spin coating or inkjet printing, but it can also be applied by evaporation.

Figure 6E:
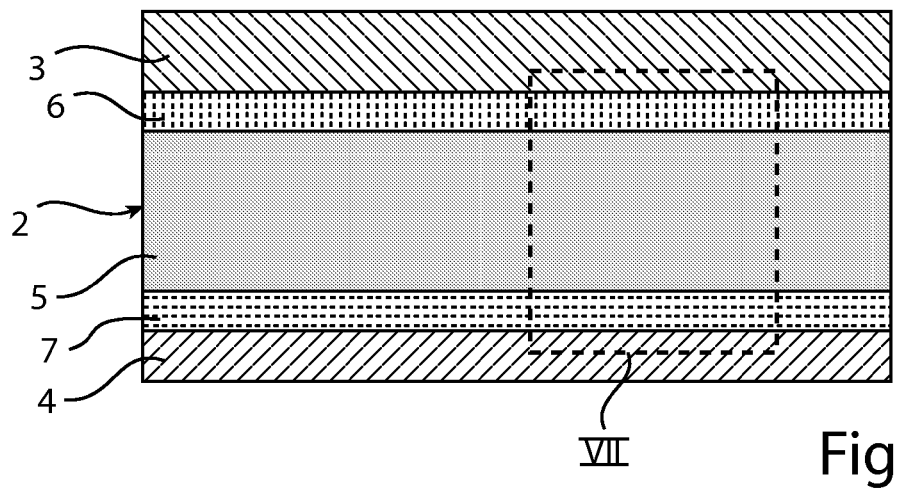
FIG. 6e illustrates a fifth step in fabricating a laminate for a diode according to the invention.

Finally a first electrode 3, that is to function as a cathode in forward bias, is provided, as is shown in FIG. 6e. Thereby a laminate 2 has been formed. The thickness of the laminate 2 depends on its function. To function properly as a light-emitting diode the laminate 2 must first be initialised.

FIGS. 7a-7d show an enlargement of the area VII shown in FIG. 6e and illustrate the steps required for initialising the laminate 2 to obtain a light-emitting diode 1.

Figure 7A:
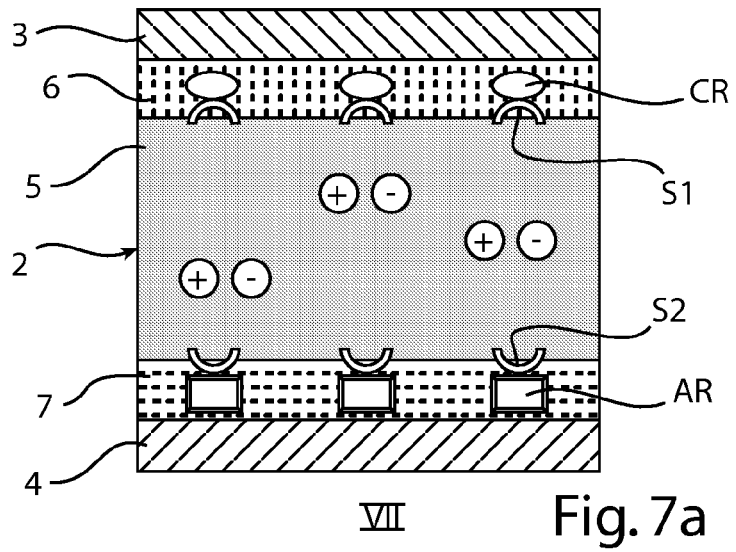
FIG. 7a is an enlarged schematic section view and illustrates the ion configuration of the laminate prior to initialisation.

FIG. 7a illustrates the laminate 2 just after it has been formed according to the steps described with reference to FIGS. 6a-6e. As shown in FIG. 7a the salt, for example lithium triflate, in the light-emitting layer 5 comprises positive ions (+) and negative ions (−). The positive ions (+) and the negative ions (−) form ion pairs that are more or less evenly distributed in the matrix of the light-emitting layer 5. As schematically shown in FIG. 7a the layer 6 of cation receptor contains a multitude of cation receptor molecules CR, each of which has a site S1 having affinity for cations, i.e. positive ions. Further the layer 7 of anion receptor contains a multitude of anion receptor molecules AR, each of which has a site S2 having affinity for anions, i.e. negative ions.

Figure 7B:
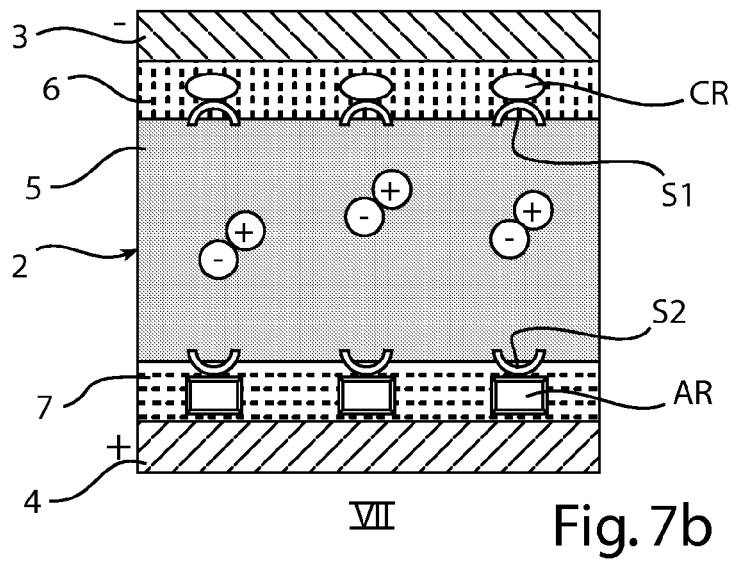
FIG. 7b illustrates the ion travel during initialisation of the laminate.

FIG. 7b illustrates the situation just after a voltage has been applied to the laminate 2 to start the initialisation. The first electrode 3 has been biased with a negative voltage, making it the cathode, and the second electrode 4 has been biased with a positive voltage, making it the anode. As can be seen the positive ions (+) have started to travel in the direction of the first electrode 3, the cathode, and the negative ions (−) have started to travel in the direction of the second electrode 4, the anode. In order to make the ions travel quicker the laminate 2, and thus the light-emitting layer 5, is preferably heated to a temperature of about 50-90° C. Further the light-emitting layer 5 could comprise an ion conductor, such as polyethyleneoxide, increasing the speed of the ion travel.

Figure 7C:
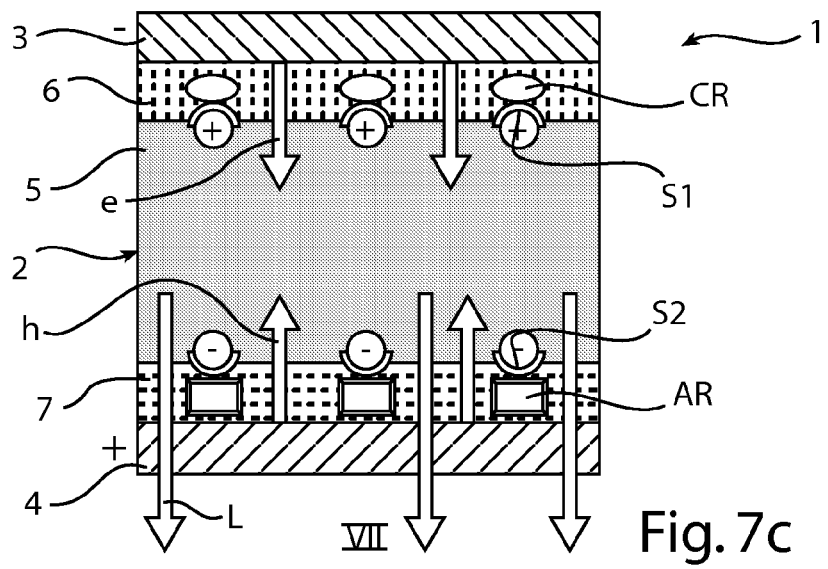
FIG. 7c illustrates the laminate just as the initialisation has been finalized and the final light-emitting diode is ready and operating.

FIG. 7c illustrates the laminate 2 at the moment the initialisation has been finalized and the diode 1 is ready for use. The positive ions (+) have been captured and immobilized by the active sites S1 of the respective cation receptor molecule CR.

Thereby a large concentration of positive ions (+) has been obtained at the first electrode 3. Due to the high ion gradient the injection barrier is narrowed and the first electrode 3, being the cathode, has started to emit electrons e. The negative ions (−) have been captured and immobilized by the active sites S2 of the respective anion receptor molecule AR. Thereby a large concentration of negative ions (−) has been obtained at the second electrode 4. Due to the high ion gradient the injection barrier is narrowed and the second electrode 4, being the anode, has started to emit holes h. The electrons e and the holes h will then recombine in the matrix of the light-emitting layer 5 under emission of light L, which is emitted via the transparent second electrode 4. It will be appreciated that the layer 7 of anion receptor is sufficiently thin and transparent to allow the emitted light L to be transmitted there through. In this state light L is thus emitted from the diode 1 according to principles similar to the general principles of a light-emitting electrochemical cell (LEC), the basic principle of which is per se known from Q. B. Pei et al, Science 269, 1086, 1995, J. Gao, G. Yu, A. J. Heeger, Appl. Phys. Lett. 71, 1293, 1997 and other documents.

Figure 7D:
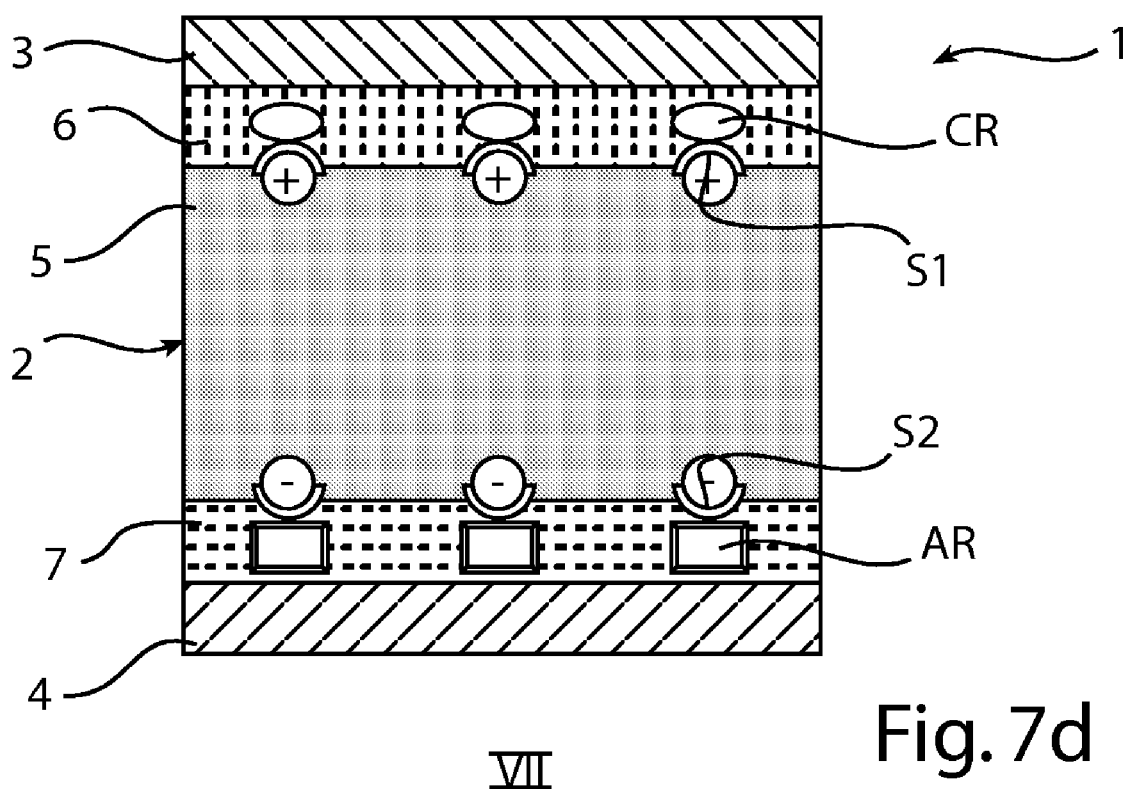
FIG. 7d illustrates the diode at rest, when there is no bias.

FIG. 7d shows the final light-emitting diode 1 at rest. As can be seen the cation receptor molecules CR still hold on to the positive ions (+), the cations, and the anion receptor molecules AR still hold on to the negative ions (−), the anions. Since the molecules CR, AR are bulky, i.e. have a large volume, they will not be able to migrate into the matrix of the light-emitting layer 5 but will remain adjacent to the respective electrode 3, 4. Thus the large ion gradients created during the initialisation described with reference to FIG. 7b to 7c is maintained also after the voltage has been removed. The ions (+), (−) are firmly immobilized by the respective molecule CR, AR and will not be released due to high temperatures. The next time of applying a forward bias, by which is meant that the first electrode 3 is biased with a negative voltage to become cathode and the second electrode 4 is biased with a positive voltage to become anode, to the light emitting diode 1, the ion gradients are already in place, since the ions are immobilized, and light emission will start immediately. Thus the diode 1 provides a very quick response to a forward bias and a low sensitivity to high temperatures, time dependent degeneration etc.

It will be appreciated that numerous variants of the above-described embodiments are possible within the scope of the appended patent claims.

For example it is described above that the first electrode 3, being the cathode in forward bias, is a high work function electrode. It will be appreciated that the light-emitting diode would work also in the event the first electrode was instead a low work function electrode. A low work function electrode, such as a barium electrode, is generally very sensitive to environmental conditions and time dependent degradation and therefore it is a great advantage of the present invention that it permits the use of a high work function electrode, such as a gold, silver or ITO electrode, as cathode since such electrode materials are generally much less sensitive to contact with oxygen etc.

Above it is described that the light-emitting layer 5 comprises a matrix and also ions. Thus the light-emitting layer 5 will, before the initialisation, form a source of ions from which the layer of cation receptor and the layer of anion receptor may capture cations and anions, respectively, during the initialisation. It is, however, not necessary that the ions are contained in the light-emitting layer from the start. An alternative is to provide the ions in a separate layer from which the ions can migrate to the layer of cation receptor and to the layer of anion receptor. For instance a PEDOT/PSS layer located between the first electrode 3 and the layer 6 of cation receptor could be provided with ions to work as a source of ions. During initialisation the cations would travel the short distance from the PEDOT/PSS layer to the layer of cation receptor and would be captured by the cation receptor molecules. At the same time the anions would migrate through the layer of cation receptor and through the light-emitting layer and finally reach the layer of anion receptor where the anions would become captured.

It will thus be appreciated that the ions, before the initialisation, could be located in one or several additional layers, such as a PEDOT/PSS layer, or could be included in the layer of the cation receptor and/or in the layer of the anion receptor as alternative to, or in addition to, being included in the light-emitting layer.

Above a couple of examples of cation and anion receptors are illustrated with reference to FIGS. 2, 3, 4 and 5. It will be appreciated that other alternative receptors are also available. For example the group generally referred to as crown ethers contains a large number of substances that could be used.

Preferably the molecules making up both the anion and cation receptors have a voluminous organic molecule part providing the necessary "bulkiness" making the receptor unable to migrate into the light-emitting layer. Thereby it is ensured that the immobilized ions remain adjacent to the respective electrode. To provide the necessary sites attracting anions or cations, as the case may be, the molecule making up the receptor is often provided with oxygen containing groups and sometimes also other inorganic groups providing the normally neutral receptor molecule with a site having a charge distribution of such kind that either anions or cations are attracted to it.

In order to provide the light-emitting diode with electrical protection, mechanical scratch protection or protection against water it could be provided with a thin protective top coating, such as a thin polymer layer provided on the first electrode or even hermetically encapsulating the entire light-emitting diode.

It is possible to make both the first electrode and the second electrode of the material indium tin oxide (ITO), or another high work function material being at least partly transparent, and thus obtain a diode in which light emission occurs through both electrodes.

FIGS. 6a-6e illustrates one way of fabricating a laminate 2. It will be appreciated that it is also possible do it the opposite way around, i.e. to start with the first electrode and laminate the further layers on top of that layer.

To summarize a light-emitting diode 1 has a first electrode 3, a second electrode 4, a light-emitting layer 5 which comprises a matrix, and ions. A layer 6 of a cation receptor CR is positioned adjacent to the first electrode 3, has captured cations, and has generated immobilized cations (+). A layer 7 of an anion receptor AR is positioned adjacent to the second electrode 4, has captured anions, and has generated immobilized anions (−). The ion gradients provide for quick response in emission of light L when the diode 1 is exposed to a forward bias.

A diode 1 is manufactured by first forming a laminate 2 of the above structure. The laminate 2 is exposed to a forward bias to make the ions become immobilized at respective sites S1, S2 of the respective receptors CR, AR.

The invention claimed is:

1. A light-emitting diode comprising a first electrode, a second electrode and a light-emitting layer being positioned between the two electrodes and comprising a matrix for providing a solid electrolyte, and ions, which are moveable in said the solid electrolyte, the diode further comprising ions, a layer of a cation receptor, the layer of the cation receptor being positioned between the first electrode and the light-emitting layer, and a layer an anion receptor, the layer of the anion receptor being positioned between the second electrode and the light-emitting layer, wherein at least one of the cation receptor and anion receptor comprises bulky molecules each having a site attracting cations and anions, respectively, the layer of cation receptor having captured cations, thereby forming a concentration of immobilized cations at the first electrode, the layer of anion receptor having captured anions, thereby forming a concentration of immobilized anions at the second electrode, wherein an ion gradient is formed providing for injection of electrons from the first electrode and of holes from the second electrode when the light-emitting diode is exposed to a forward bias.

2. A light-emitting diode according to claim 1, wherein the first electrode is made of a high work function material.

3. A light-emitting diode according to claim 1, wherein the matrix of the light-emitting layer comprises an organic material.

4. A light-emitting diode according to claim 3, wherein the matrix of the light-emitting layer comprises a polymeric material.

5. A light-emitting diode according to claim 3, wherein the matrix of the light-emitting layer comprises an ion conductor.

6. A light-emitting diode according to claim 1, wherein the electrodes, the layer of the cation receptor, the layer of the anion receptor, and the light-emitting layer form a thin laminate, at least one of the first electrode and the second electrode, and the layer of the cation or anion receptor positioned adjacent thereto, being made from transparent materials such that the light emitted by the light-emitting diode may be transmitted through said at least one electrode and said layer of the cation or anion receptor positioned adjacent thereto.

7. A method of forming a light-emitting diode having a first electrode, a second electrode and a light-emitting layer being positioned between the two electrodes and comprising a matrix for providing a solid electrolyte, and ions which are movable in said solid electrolyte, the diode further comprising ions, the method comprising:

providing a layer of a cation receptor between the first electrode and the light-emitting layer, and a layer of an anion receptor between the second electrode and the light emitting layer, wherein at least one of the cation receptor and anion receptor comprises bulky molecules each having a site attracting cations and anions, respectively, applying an electrical field over the electrodes to make the first electrode the cathode and the second electrode the anode, such that the layer of cation receptor captures and immobilizes cations, thereby forming a concentration of immobilized cations at the first electrode, and that the layer of anion receptor captures and immobilizes anions, thereby forming a concentration of immobilized anions at the second electrode, said immobilized cations and said immobilized anions forming ion gradients providing for injection of electrons from the first electrode and of holes from the second electrode when the light-emitting diode is exposed to a forward bias.

8. A method according to claim 7, wherein the light-emitting layer is heated during said applying an electrical field over the electrodes.

* * * * *